(12) United States Patent
Tang et al.

(10) Patent No.: US 8,861,559 B2
(45) Date of Patent: Oct. 14, 2014

(54) METHOD TO DRIVE SEMICONDUCTOR LASER DIODE

(75) Inventors: Fengliang Tang, Yokohama (JP); Kentarou Kitagawa, Yokohama (JP)

(73) Assignee: Sumitomo Electric Device Innovations, Inc., Kanagawa (JP)

( * ) Notice: Subject to any disclaimer, the term of this patent is extended or adjusted under 35 U.S.C. 154(b) by 268 days.

(21) Appl. No.: 13/433,489

(22) Filed: Mar. 29, 2012

(65) Prior Publication Data

US 2012/0236888 A1 Sep. 20, 2012

(30) Foreign Application Priority Data

Dec. 28, 2010 (JP) .............................. P2010-293791

(51) Int. Cl.
*H01S 3/00* (2006.01)
*H01S 5/0683* (2006.01)
*H01S 5/00* (2006.01)

(52) U.S. Cl.
CPC ............. *H01S 5/0683* (2013.01); *H01S 5/0014* (2013.01); *H04S 5/0617* (2013.01)
USPC ......... 372/38.02; 372/8; 372/26; 372/29.014; 372/29.015; 372/29.021; 372/33; 372/34; 372/29.01; 372/38.01; 372/38.07

(58) Field of Classification Search
CPC . H01S 5/0683; H01S 5/06832; H01S 5/0617; H01S 5/06804; H01S 5/042; H01S 5/0427; H01S 5/06825; H01S 5/0014; H01S 5/06812; H01S 5/06213; H01S 5/06835; H01S 5/06209; H01S 5/06808; H01S 5/0085; H01S 5/068; H01S 5/4025; H01S 3/0014; H01S 5/02212; H01S 5/02284; H01S 5/02415; H01S 5/0428

USPC .......... 372/8, 26, 29.014, 29.015, 29.021, 33, 372/34, 38.02, 29.01, 38.301, 38.07
See application file for complete search history.

(56) References Cited

U.S. PATENT DOCUMENTS 5,844,928 A * 12/1998 Shastri et al. .............. 372/38.02
6,292,497 B1    9/2001 Nakano
(Continued)

FOREIGN PATENT DOCUMENTS

JP       11-135871       5/1999
JP       2004-61556 A    2/2004
(Continued)

OTHER PUBLICATIONS

JP- 2006-332345, English translation.*

(Continued)

*Primary Examiner* — Colleen Matthews
*Assistant Examiner* — Delma R Forde
(74) *Attorney, Agent, or Firm* — Smith, Gambrell & Russell LLP (57) ABSTRACT

A method or algorithm to control a driving current supplied to a semiconductor laser diode (LD) is disclosed. the method first prepares the look-up-table (LUT) that stores a set of parameters, $\alpha$ and $\beta$, for evaluating the modulation current Im by the equation of $Im = \alpha \times Ib + \beta$, where Ib is determined by the auto-power-control (APC) loop. In a practical operation of the LD, the APC loop determines Ib, while, Im is calculated according to the equation above by reading above two parameters corresponding to the current temperature of the LD from the LUT.

1 Claim, 7 Drawing Sheets

(56) References Cited

U.S. PATENT DOCUMENTS

| | | | |
|---|---|---|---|
| 7,321,606 B2* | 1/2008 | Wu et al. | 372/38.1 |
| 7,433,375 B2* | 10/2008 | Wu et al. | 372/29.021 |
| 2002/0093999 A1* | 7/2002 | Tanaka | 372/38.01 |
| 2003/0118063 A1* | 6/2003 | Sugawara | 372/38.02 |
| 2006/0153256 A1* | 7/2006 | Sanchez | 372/34 |
| 2007/0160095 A1* | 7/2007 | Kitagawa et al. | 372/29.012 |
| 2010/0322271 A1* | 12/2010 | Ichino et al. | 372/26 |
| 2012/0020381 A1* | 1/2012 | Ishizaka | 372/38.02 |
| 2012/0327964 A1* | 12/2012 | Ichino et al. | 372/29.015 |

FOREIGN PATENT DOCUMENTS

| | | |
|---|---|---|
| JP | 2004-221587 A | 8/2004 |
| JP | 2004-349532 A | 12/2004 |
| JP | 2006-332345 A | 12/2006 |
| JP | 2009-111259 A | 5/2009 |
| JP | 2011-3743 A | 1/2011 |
| WO | 02/069464 A1 | 9/2002 |

OTHER PUBLICATIONS

JP- 2004-221587, English translation.*

JP- 2004-349532, English translation.*

Notice of Reasons for Rejection for Japanese Application No. P2010-293791 mailed Dec. 4, 2012 (English language translation attached).

* cited by examiner

METHOD TO DRIVE SEMICONDUCTOR LASER DIODE

BACKGROUND OF THE INVENTION

1. Field of the Invention

The present invention relates to a method to driver a semiconductor laser diode

2. Related Background Art

Various prior arts have disclosed an algorithm and a circuit to drive a semiconductor laser diode so as to make the optical output power and the extinction ratio (hereafter denoted as ER) invariant with respect to temperatures and the ageing. For instance, a Japanese patent application published as JP-H11-135871A has reported one of such algorithms and circuits where the LD is driven by superposing a bias current slightly greater than the threshold current of the LD with a pulse current, which is sometimes called as a modulation current, to generate laser light, and those bias and modulation currents are varied depending on an ambient temperature of the LD to keep the optical output power and the ER in constant.

Figure 3:
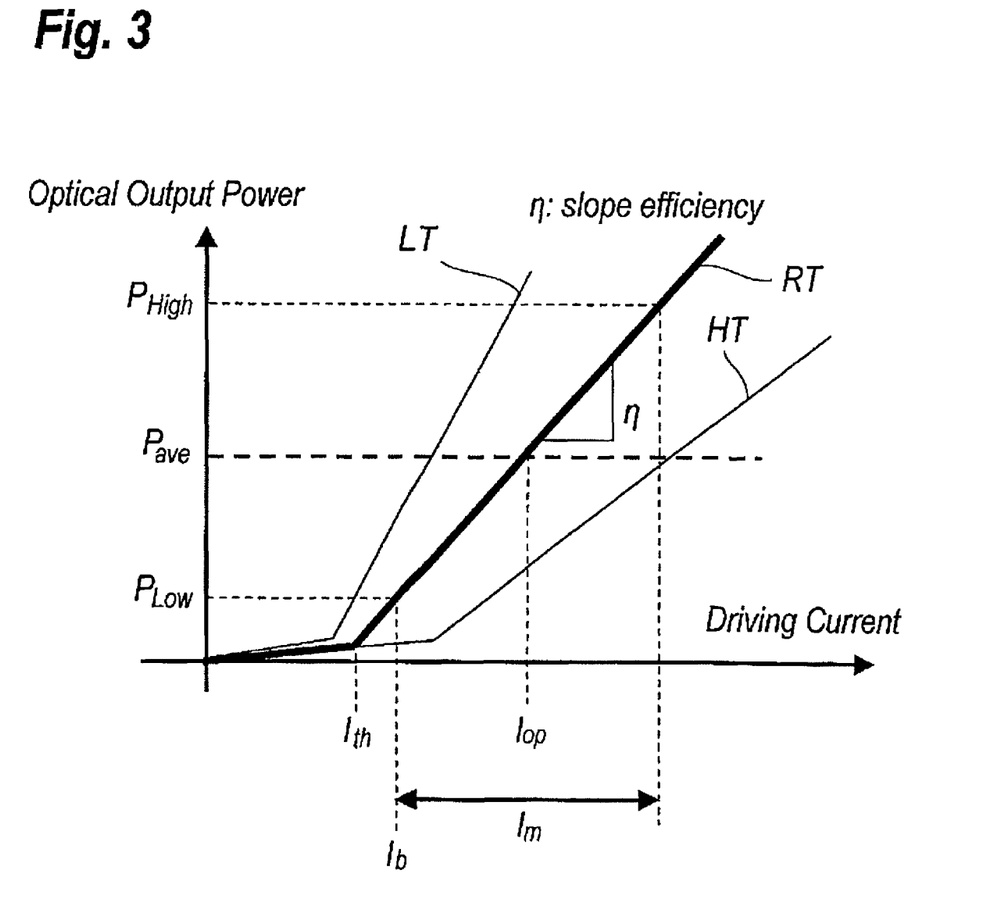
FIG. 3 roughly describes temperature characteristics of an LD.

An average optical power $P_{ave}$ output from the LD depends on the bias current Ib and the modulation current Im applied to the LD. Generally, the bias current is set to be slightly greater than the threshold current (hereafter denoted as Ith) of the LD because Ib less than the Ith strongly affects the modulation characteristic of the LD, specifically, the rising of the optical output accompanies with some delays. The Im is adjusted, based on thus defined Ib, to show in the optical output therefrom the preset extinction ratio ER. FIG. 3 shows relations of the optical output power against the current supplied to the LD, where this relation is called as the I-L characteristic, in various temperatures.

As shown in FIG. 3, an LD inherently shows large temperature dependence in electrical and optical parameters thereof. The emission efficiency, which is sometimes called as the slope efficiency denoted as η, degrades and Ith increases in higher temperatures. Accordingly, it is necessary to set larger Ib and Im in high temperatures compared with those at a room temperature. On the other hand, the slope efficiency η becomes large while the threshold current Ith decreases in low temperatures, then, it is necessary to decrease both of Ib and Im in a low temperature compared with those at the room temperature.

An auto-power control (APC) has been well known to compensate the temperature dependence of the LD described above, where a portion of the light generated by an LD is monitored by a photodiode (PD), and each currents, Ib and Im, are adjusted to set the monitored output optical power the extinction ratio in constant. Three algorithms (1) to (3) below presented are applied to the APC:
(1) monitoring the peak power $P_{High}$ and the bottom power $P_{Low}$ independently, and controlling currents Ib and Im to keep the peak power $P_{High}$ and the bottom power $P_{Low}$;
(2) monitoring the average power $P_{ave}$ and the extinction ratio ER of the optical output, and two currents Ib and Im are controlled to keep these parameters, $P_{ave}$ and ER; and
(3) controlling Ib to keep the monitored average power $P_{ave}$ in constant by the APC, and setting Im from thus determined Ib based on a look-up-table (LUT) that stores a relation between two current Ib and Im measured in advance to a practical operation.

Former two algorithms, (1) and (2), are necessary to monitor two parameters and to feedback the monitored results to two currents Ib and Im, which may enhance the preciseness and the stability of the APC control; but requires the PD to follow the modulation speed. The response of the PD may influence the stability and the preciseness of the APC control. Moreover, such a PD with superior frequency performance is generally expensive.

The third algorithm requires to prepare the LUT determining the relation between two currents Ib and Im. In order to make the size of the LUT compact, only the coarse data are prepared and conditions of currents, Ib and Im, are evaluated by interpolation/extrapolation of the coarse data. Thus, the third algorithm needs only one monitored condition; but the LUT is necessary to be prepared in advance to the practical operation. Moreover, when another condition for the extinction ratio ER is set, the LUT prepared above must be revised. In addition, when the APC determines the current Ib and the LUT determines the other current Im based on thus determined current Ib, newly evaluated current Im may vary the average power $P_{ave}$, which revises not only the bias current Ib but the modulation current Im. Thus, the control loop to determine the currents, Ib and Im, occasionally becomes unstable.

Still further, when the LD is necessary to be operated in wider temperature range, for instance, between −40° C. to 85° C., and in higher speed, for instance, faster than 10 Gbps; electronic devices practically applicable thereto are so limited. One example shows that, even when the current conditions for an LD are satisfied in a high temperature by the third algorithm, the degradation of the electronic device, namely, an LD-driver, causes an extraordinary in the modulation current Im in a low temperature.

SUMMARY OF THE INVENTION

One aspect according to an embodiment of the present invention relates to a method to control an LD. The method may include steps of: preparing an LUT in advance to the practical operating of the LD, sensing a current temperature of the LD, calculating the modulation current Im, and supplying the modulation current Im and the bias current Ib, which may be determined by the APC loop, to the LD. A feature of the method according to an embodiment, the LUT may store a set of parameters $(\alpha, \beta)_{Ti}$ (i=1 1 to n), each of sets may determine the modulation current Im according to the equation of:

$$Im = \alpha_{Ti} \times Ib + \beta_{Ti};$$

where a set of the modulation current Im thus calculated and the bias current Ib determined by the APC loop may operate the LD in the predetermined conditions of the average output optical power and the extinction ratio.

A conventional algorithm to control an LD, for instance, the third algorithm described above, is necessary to prepare a large number of sets of two currents, Ib and Im, in order to control the LD precisely. The algorithm/method according to an embodiment of the invention requites only two parameters, α and β, for one operating temperature. Accordingly, even when an optical transmitter is requested to control the LD precisely at a low temperature and a higher speed, the method of the embodiment may supply two currents for the LD to set in a condition of the predetermined average power and extinction ratio.

The method according to an embodiment may modify the step to prepare the LUT. That is, the step to prepare the LUT may include further step to evaluate a linear dependence of two parameters, α and β, against the temperature. Specifically, the step to prepare the LUT may include a step to evaluate equations of:

$$\alpha(T) = a_\alpha \times T + b_\alpha, \text{ and}$$

$$\beta(T) = a_\beta \times T + b_\beta.$$

The method may store only four parameters, $a_\alpha$, $b_\alpha$, $a_\beta$, $b_\beta$ and by in the LUT. Then, the step to calculate the modulation current Im may include a step to calculate two parameters, $\alpha(T)$ and $\beta(T)$, for a sensed temperature T, and to calculate the modulation current Im based on these two parameters, $\alpha(T)$ and $\beta(T)$, and the bias current Ib determined by the APC loop. Thus, the modified method may store only four parameters in the LUT, which may further compact the size of the LUT.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF THE PREFERRED EMBODIMENTS

Next, some embodiments according to the present invention will be described as referring to accompanying drawings. In the description of the drawings, the same numerals or symbols will refer to the same elements without overlapping explanations.

Figure 4:
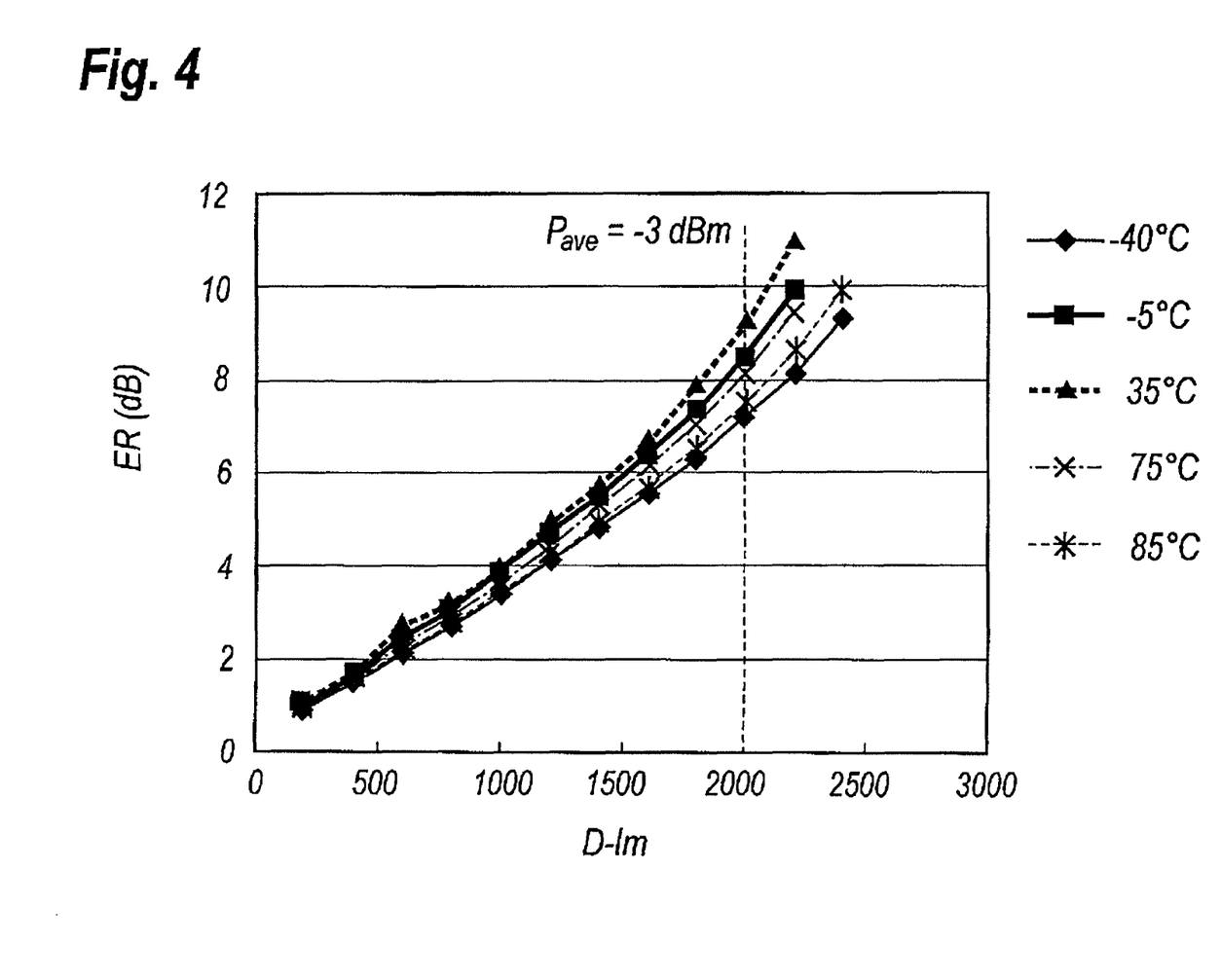
FIG. 4 shows relations between the modulation current and the extinction ratio at various temperatures as keeping the average output power in constant.

FIG. 4 shows behaviors of the extinction ratio ER against the modulation current Im in respective temperatures from −40 to 85° C. In FIG. 4, the extinction ratio ER was measured in various temperatures as setting the average output power $P_{ave}$ in −3 dBm. The horizontal axis denotes the digital value D-Im directly set in the D/A-C for the modulation current Im. As shown in FIG. 4, even the digital value D-Im is set in 2000, the extinction ratio ER reduces as the temperature increases.

Figure 5:
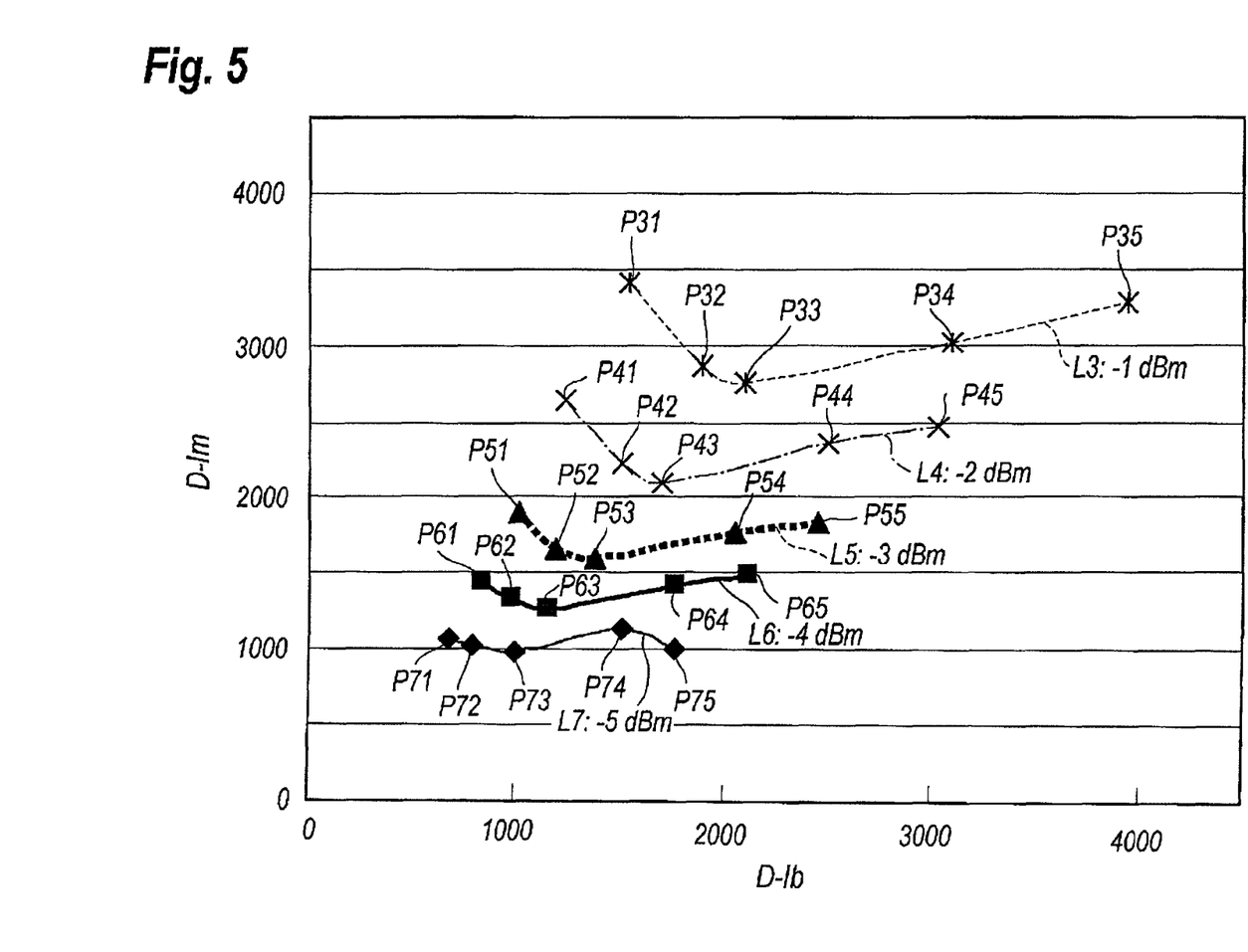
FIG. 5 shows relations between the bias current and the modulation current to keep the preset extinction ratio at various temperatures by the average output power as parameters.

FIG. 5 shows behaviors of the modulation current Im against the bias current Ib, where each of behaviors was measured, as keeping the extinction ratio ER in a preset condition, to show respective average output power $P_{ave}$, −5 to −1 dBm, at various temperatures from −40° C. to +85° C. The points, P31 to P35, correspond to a combination of currents, Im and Ib, in the digital value set in the D/A-Cs for providing the average power of −1 dB at temperatures of −40, −5, +35, +75, and +85° C., respectively. The points, P41 to P45, correspond to the combination of two currents, Im and Ib, to show the average output power of −2 dBm at temperatures of, −40, −5, +35, +75, and +85° C., respectively. A series of points, P51 to P55, P61 to P65, and P71 to P75, each corresponds to the average output power of −3, −4, and −5 dBm, respectively, and temperatures same as those afore mentioned.

As shown in FIG. 5, behaviors, L3 to L7, explicitly show a concave; that is, the current D-Im to get the constant extinction ratio increases in relatively high and low temperatures so as to show a minimum around the room Temperature. Accordingly, when the third algorithm is applied to get the modulation current D-Im for a given bias current D-Ib, the modulation current D-Im sometimes overflows, or, even if it does not overflow, exceeds a preset alarm level.

Figure 6:
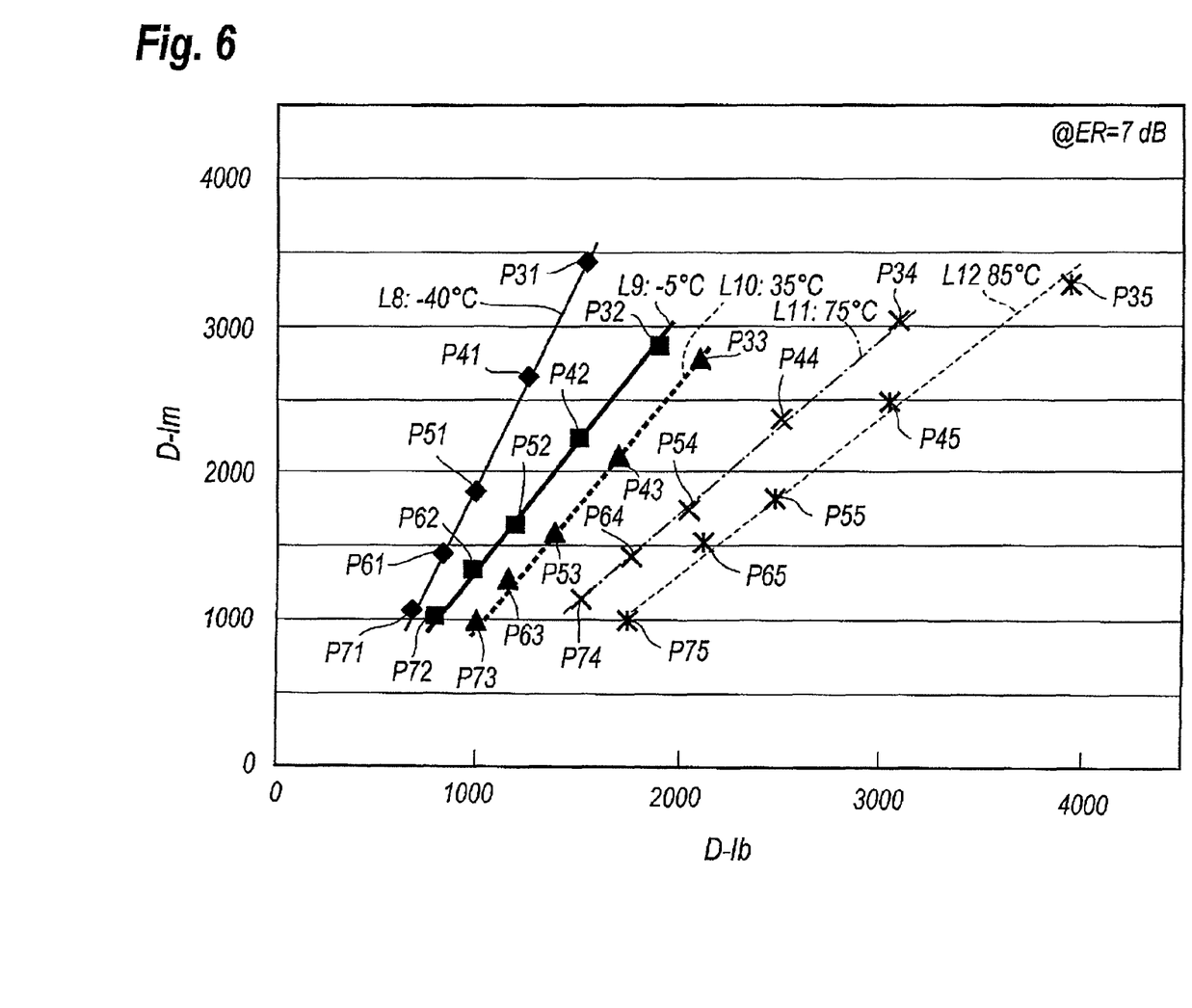
FIG. 6 shows relations between the bias current and the modulation current to keep the preset extinction ration for respective average output power by the temperature as parameters.

Then, invertors of the present invention rearrange behaviors between two currents, Ib and Im, shown in FIG. 5, as those shown in FIG. 6. That is, connecting points, P31 to P71, P32 to P72, and so on each corresponding to isothermal conditions, behaviors L8 to L12 appeared in FIG. 6 may be obtained. Points P31 to P71 of the behavior L8 shows a result measured at −40° C., points P32 to P72 of the behavior L9 shows a result in −5° C., points P33 to P73 of L10 correspond to a result in 35° C., points P34 to P74 of L11 correspond to a result in 75° C., and points P35 to P75 of the behavior L12 shows a result measured at 85° C. As shown in FIG. 6, respective behaviors, L8 to L12, are substantially linear; that is, the digital values set in the D/A-C for Im has the linear dependence of the digital values set in the D/A-C for Ib at the isothermal temperature. Assuming parameters $\alpha_n$ and $\beta_n$ denoting the linear dependence shown in FIG. 6, the behaviors L8 to L10 may be given by:

$$(D\text{-}Im)\alpha_n \times (D\text{-}Ib) + \beta_n \quad (n=8 \text{ to } 12 \text{ for respective behaviors}).$$

Because the D/C–Cs also shows a liner dependence of the analog output against the digital input, the relation above may directly converted to:

$$\alpha_n' \times Ib + \beta_n'.$$

Specifically, behaviors L8 to L12 of FIG. 6 have parameters as follows:

| n | α | β |
|---|---|---|
| 8 | 2.735 | −807.0 |
| 9 | 1.674 | −301.7 |
| 10 | 1.591 | −592.0 |
| 11 | 1.200 | −684.7 |
| 12 | 1.034 | −733.6 |

Thus, the LUT storing linear parameters $\alpha_n$ and $\beta_n$ for temperatures instead of relations between the currents, Im and Ib, in a conventional scheme may make the size of the LUT small. In order to enhance the preciseness of the current Im in the conventional algorithm, relations between two currents, Ib and Im, are necessary to be finely prepared in the LUT, that is, the data for the bias current Ib are finely prepared in order to determine the modulation current exactly following to the temperature. The present algorithm, comparing with the conventional algorithm described above, requires only two parameters, $\alpha$ and $\beta$, for an average output power independent of the temperature. Accordingly, even when the LD is operated at a high speed in a low temperature, the value D-Im set in the D/A-C for the modulation current Im may be adequately obtained based on the other value D-Ib which is automatically determined by the APC. The method according to the embodiment only monitors the average optical power output from the LD, which is unnecessary to prepare a PD with excellent performance to follow the modulation speed of the LD. Even when the output from the PD degrades in high frequencies; or can not follow the modulation of the LD, such degradation of the signal output from the PD does not affect the current control of the LD.

Moreover, the procedure to prepare two parameters, $\alpha$ and $\beta$, are same as those performed in the conventional algorithm.

That is, combinations of two currents, Ib and Im, are measured for various output power at a temperature as keeping the extinction ratio ER in a preset value. The algorithm according to the embodiment may drastically reduce the number of parameters to be stored in the LUT.

Figure 7:
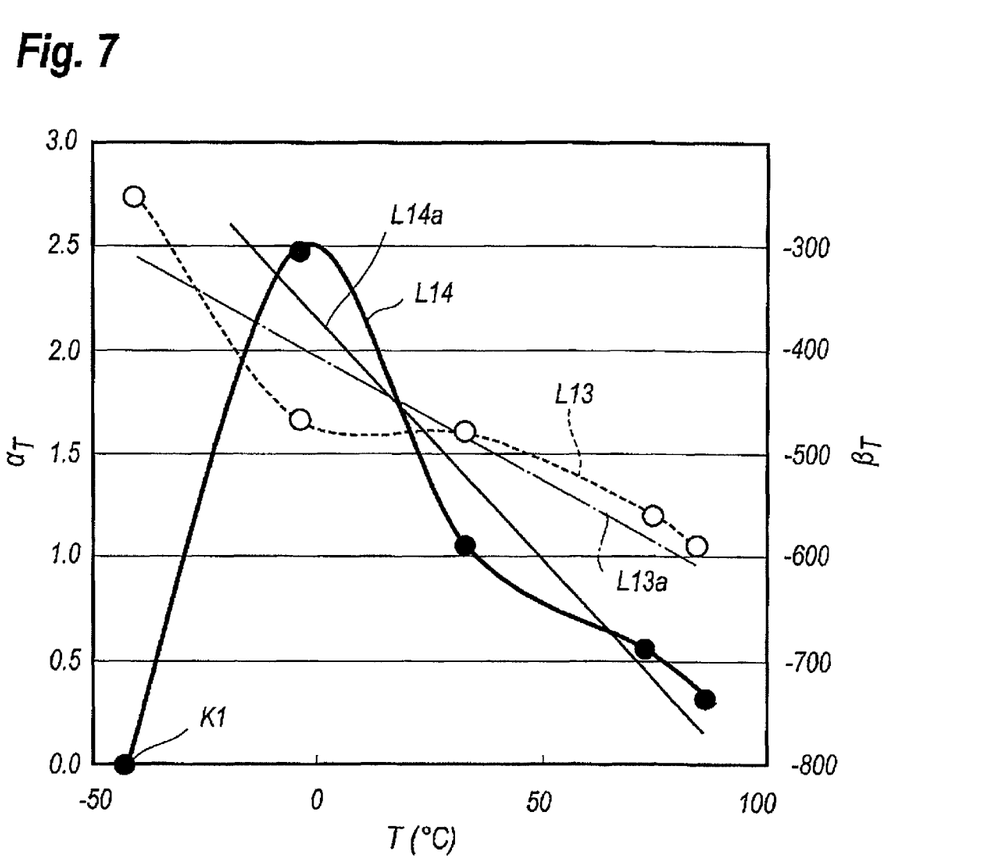
FIG. 7 shows relations of parameters, $\alpha$ and $\beta$, to calculate the modulation current against the temperature.

FIG. 7 shows temperature dependence of two parameters, α and β. The behavior L13 corresponds to the parameter α; while, the other behavior L14 denotes the parameter β. Two behaviors, L13 and L14, except for the point K1 corresponding to the parameter β at the temperature of −40° C., may be approximately denoted as the linear function of:

$$L13a = a_\alpha \times T + b_\alpha \text{ and}$$

$$L14a = a_\beta \times T + b_\beta.$$

Specific values for the parameters defined above become, ($a_\alpha$, $b_\alpha$), and ($a_\beta$, $b_\beta$) are (−0.0117, 1.9983), and (−4.559, −361.27), respectively.

Accordingly, the algorithm according to the present embodiment may estimate the relation between two values, D-Ib and D-Im, set in respective D/A-C for operating the LD only by measuring two currents, Ib and Im, as varying the average optical power output from the LD but keeping the extinction ratio in the preset value at least two temperatures.

The third algorithm conventionally applied to control an LD requires measurements to get the relation between two currents, Ib and Im, under which the average output power and the extinction ratio become respective values, under at least three temperatures, for instance, a low temperature, a room temperature and a high temperature. While, the algorithm according to an embodiment of the invention requires measurements of the currents, Ib and Im, under only two temperatures. The measurement of the relation between two currents, Ib and Im, at one temperature may evaluate two parameters, $\alpha_1$ and $\beta_1$, and another measurement thereof at another temperature may reduce another pair of parameters, $\alpha_2$ and $\beta_2$; then, the relation for the α(T) and β(T) shown in FIG. 7 may be calculated based on these measured parameters, $\alpha_1$, $\beta_1$, $\alpha_2$ and $\beta_2$. In the practical operation of the LD to keep the average output power $P_{ave}$ and the extinction ratio ER in respective preset value may be preformed by referring to the LUT that stores only two parameters, α(T) and β(T), and calculating the values set in respective D/A-Cs.

Figure 1:
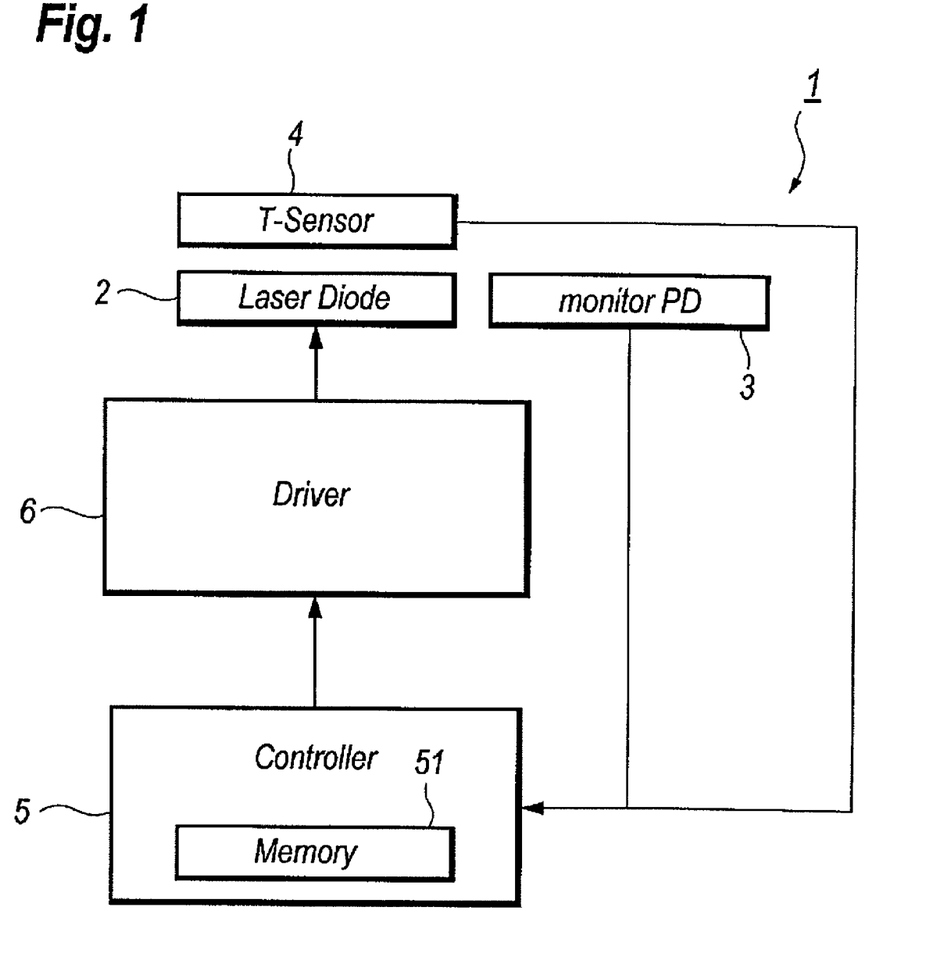
FIG. 1 shows a functional block diagram of an optical transmitter.

The algorithm thus described above according to an embodiment of the invention may be applied to an optical transmitter whose functional block diagram is shown in FIG. 1. The optical transmitter 1 shown in FIG. 1 includes an LD 2, a PD 3, a temperature sensor 4, a controller 5, and a driver 6.

The LD 2 may generate light responding to the bias current Ib and the modulation current Im each provided from the driver 6. The PD 3 may detect a portion of light generated by the LD 2 and output a monitoring signal to the controller 5. The temperature sensor 4, which may be a thermistor, is installed in immediate neighbor to the LD 2 to detect a temperature thereat, which may regards the detected temperature as a temperature of the LD 2.

The controller 5 may include a central processing unit (CPU), a read-only-memory (ROM), and a random access memory (RAM). The controller 5 may further include another memory 51 such as, what is called, a flush ROM or a removable storage. The CPU in the controller 5 may carry out a program stored in the memory 51, for instance a program to perform the APC and the flow chart shown in FIG. 2. The controller 5 thus operated may generate a current control signal, which controls the bias current Ib to be provided to the LD 2, to the driver 6. Specifically, the controller 5 may perform the APC by receiving the monitoring signal generated by the PD 3 and generating the current control signal so as to keep the monitoring signal in a preset reference. The controller 5 may also generate another current control signal corresponding to the modulation current Im according to the aforementioned algorithm of the present embodiment. The driver 6 supplies two currents, Ib and Im, to the LD 2 based on the current control signals each of respective currents, Ib and Im.

Figure 2:
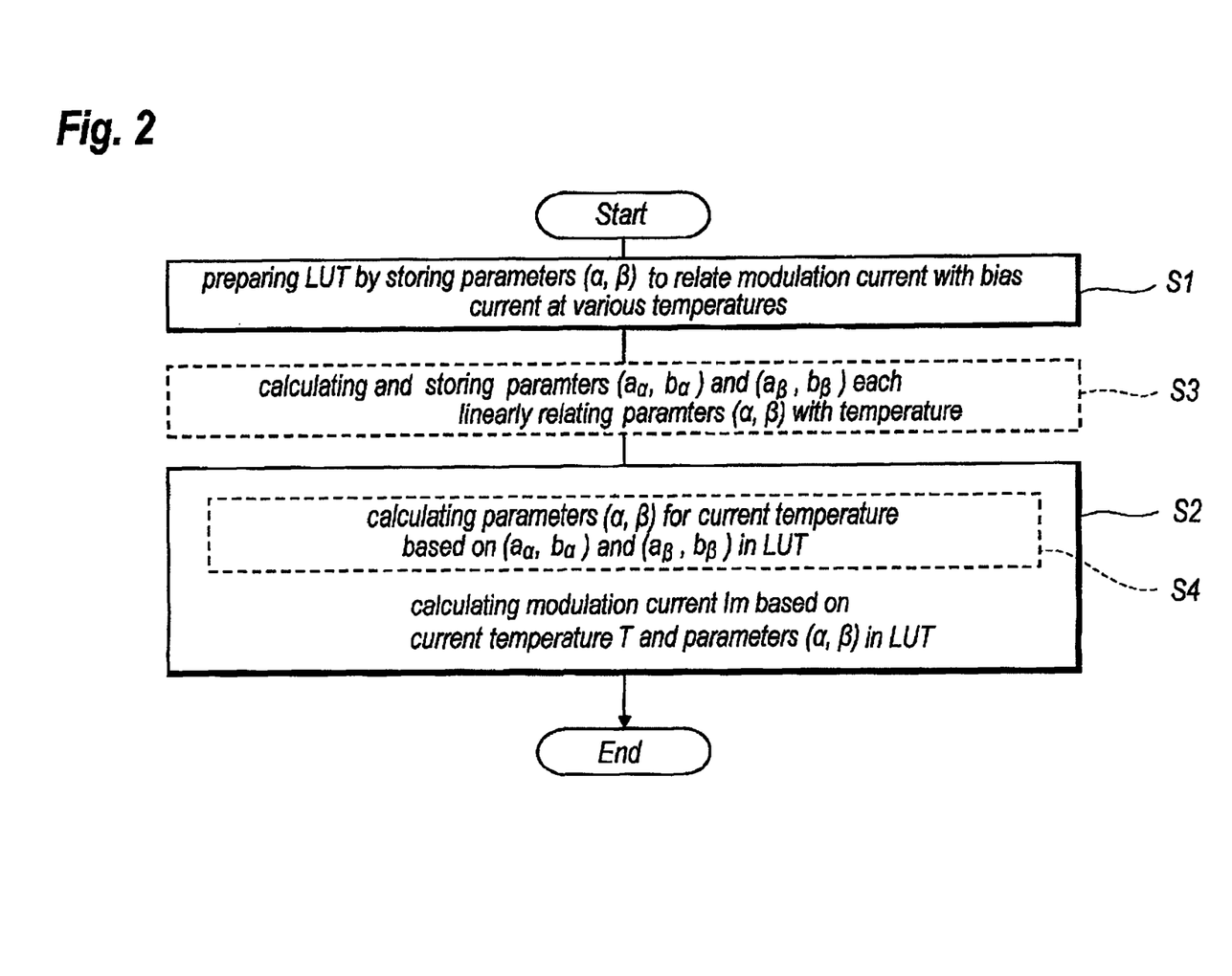
FIG. 2 is a flow chart showing a method to control an LD.

Next, a method to drive the LD 2 in the optical transmitter 1 will be described as referring to FIG. 2. In advance to the practical operation of the optical transmitter 1, the method firstly evaluates two parameters, $\alpha(T_1)$ and $\beta(T_1)$, at a temperature $T_1$. Specifically, setting the temperature of the LD 2 to $T_1$ and operating the APC as varying the target average power $P_{ave}$ output from the LD 2, the modulation current Im is determined to get the extinction ratio ER to be the preset value. Thus, a set of two digital values, $\{D-Ib(T_1)\}_{Pj}$ and $\{D-Im(T_1)\}_{Pj}$ (j=1 to m), set in the D/A-Cs for respective currents may be obtained at the temperature $T_1$. The set of two digital parameters above described may provide two parameters, $\alpha(T_1)$ and $\beta(T_1)$, which may show the linear behavior shown in FIG. 6.

Then, varying a temperature of the LD 2 to another temperature $T_2$, the same procedures to get two digital values, $\{D-Ib(T_2)\}_{Pk}$ and $\{D-Im(T_2)\}_{Pk}$ (k=1 to l), and to evaluate two parameters, $\alpha(T_2)$ and $\beta(T_2)$, are iterated at the second temperature $T_2$. Then, two parameters, $\alpha(T_2)$ and $\beta(T_2)$ are to be stored in the memory 51. Iterating the procedures to vary the temperature of the LD 2, evaluating two parameters, $\alpha(T_i)$ and $\beta(T_i)$, and storing thus evaluated parameters in the memory 51, the creation of the LUT in the memory 51 may be performed.

Next, in the practical operation of the optical transmitter 1 at step S2, the controller 5 may determine the value D-Ib set in the D/A-C for the bias current Ib by the APC loop, and detect the current temperature of the LD 2 through the temperature sensor 4. The controller 5 may determine the other value D-Im for the modulation current Im by referring to the current temperature and the linear parameters, α and β, in the memory 51. That is, the controller 5 fetches two parameters, α and β, corresponding to the current temperature from the memory 51 and calculates the value D-Im according to the equation of:

$$(D\text{-}Im) = \alpha \times (D\text{-}Ib) + .$$

When the LUT in the memory 51 does not prepare two parameters, α and β, just corresponding to the current temperature, the controller 5 may select two parameters corresponding to a temperature closest to the current temperature, or, may calculate two parameters by extrapolating/interpolating two values corresponding to temperatures put the current temperature therebetween. Thus, the optical transmitter 1 may set the bias current Ib and the modulation current Im in respective adequate values precisely.

In a modification of the method according to an embodiment, the linear relation shown in FIG. 7 may be prepared after step 1. That is, the method may calculate two parameters, $a_\alpha$ and $b_\alpha$, which gives the behavior L13a in FIG. 7, by a set of parameters, $\alpha(T_i)$ (i=1 to n), and other two parameters, $a_\beta$ and $b_\beta$, which gives the behavior L14a, by another set of parameters, $\beta(T_i)$ (i=1 to n). Then, only four parameters, $a_\alpha$, $b_\alpha$, $a_\beta$ and $b_\beta$, are stored in the memory 51, at step S3.

In a practical operation of the optical transmitter 1, the controller 5 may calculate α(T) and β(T) by referring four parameters, $a_\alpha$, $b_\alpha$, $a_\beta$ and $b_\beta$, in the memory 51 and the current temperature sensed by the temperature sensor 4. Finally, the controller 5 may estimate the value D-Im set in the D/A-C for the modulation current by the equation of:

$$(D\text{-}Im) = \alpha(T) \times (D\text{-}Ib) + \beta(T),$$

where D-Ib is the value set in the D/A-C for the bias current Ib and determined by the APC loop.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A method to drive a semiconductor laser diode (LD) by supplying a bias current determined by an auto-power control (APC) loop and a modulation current Im calculated from the bias current based on a linear dependence of Im=α×Ib+β, the method comprising steps of:

preparing a look-up-table (LUT) by procedures including,
evaluating a plurality of sets of two parameters, $(\alpha, \beta)_i$ (i=1 to n), at respective temperatures $T_i$ (i=1 to n),
evaluating a first linear dependence of one of parameters, $\alpha_i$ (i=1 to n), against temperatures to determine a slope and a y-intercept, $a_\alpha$ and $b_\alpha$, of the first linear dependence, respectively and a second linear dependence of another of parameters, $\beta_i$ (i=1 to n), against temperatures to determine a slope and a y-intercept, $a_\beta$ and $b_\beta$, of the second linear dependence, respectively,
storing two slopes, $a_\alpha$ and $a_\beta$, and other two y-intercepts, $b_\alpha$ and $b_\beta$, in the LUT;
sensing a current temperature T of the LD;
calculating a set of parameters $(\alpha, \beta)_T$ by referring to two slopes, $a_\alpha$ and $a_\beta$ and two y-intercepts, $b_\alpha$ and $b_\beta$ in the LUT, according to equations of:

$\alpha_T = a_\alpha \times T + b_\alpha$, and $\beta_T = a_\beta \times T + b_\beta$.

* * * * *